United States Patent
Li

(10) Patent No.: US 10,038,047 B2
(45) Date of Patent: Jul. 31, 2018

(54) LIGHT EMITTING DIODE PACKAGING STRUCTURE AND PACKAGING METHOD

(71) Applicant: BOE TECHNOLOGY GROUP CO., LTD., Beijing (CN)

(72) Inventor: Yi Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/035,753

(22) PCT Filed: Dec. 10, 2015

(86) PCT No.: PCT/CN2015/096938
§ 371 (c)(1),
(2) Date: May 11, 2016

(87) PCT Pub. No.: WO2016/184082
PCT Pub. Date: Nov. 24, 2016

(65) Prior Publication Data
US 2017/0104052 A1     Apr. 13, 2017

(30) Foreign Application Priority Data

May 21, 2015 (CN) .......................... 2015 1 0263825

(51) Int. Cl.
*H01L 33/00* (2010.01)
*H01L 27/32* (2006.01)
(Continued)

(52) U.S. Cl.
CPC ........ *H01L 27/3276* (2013.01); *H01L 27/323* (2013.01); *H01L 51/5246* (2013.01); *H01L 51/56* (2013.01); *H01L 2227/323* (2013.01)

(58) Field of Classification Search
CPC .................................................. H01L 27/3276
(Continued)

(56) References Cited

U.S. PATENT DOCUMENTS 6,255,706 B1 * 7/2001 Watanabe ............. H01L 29/458
                                                                257/350
2012/0293064 A1    11/2012 Hong
(Continued)

FOREIGN PATENT DOCUMENTS

CN         101044627 A         9/2007
CN         101131944 A         2/2008
(Continued)

OTHER PUBLICATIONS

The Decision of Rejection in the Chinese Patent Application No. 201510263825.7, dated Apr. 27, 2017; English translation attached.
(Continued)

*Primary Examiner* — Ajay K Arora
(74) *Attorney, Agent, or Firm* — Intellectual Valley Law, P.C.

(57) ABSTRACT

The present application discloses a light emitting diode packaging structure comprising a base substrate; a metal lead on the base substrate; a cover plate; and a seal frame sealing the cover plate and the base substrate together and forming an enclosure surrounding a display area of the base substrate. The metal lead extends from the display area outwardly and passes through below the seal frame to outside of the enclosure. The metal lead has a curved configuration in plan view of the base substrate within a region where the metal lead overlaps with the seal frame.

20 Claims, 4 Drawing Sheets

(51) Int. Cl.
*H01L 51/52* (2006.01)
*H01L 51/56* (2006.01)

(58) Field of Classification Search
USPC .......................................................... 257/99
See application file for complete search history.

(56) References Cited

U.S. PATENT DOCUMENTS

2014/0096823 A1\* 4/2014 Fu ................... H01L 31/022433
    136/256
2015/0102293 A1 4/2015 Cho et al.

FOREIGN PATENT DOCUMENTS

| CN | 102163580 A | | 8/2011 |
|---|---|---|---|
| CN | 104157792 A | \* | 11/2014 |
| CN | 104332562 A | | 2/2015 |
| CN | 104882566 A | | 9/2015 |
| JP | 08335659 A | \* | 12/1996 |
| JP | 2001281694 A | | 10/2001 |

OTHER PUBLICATIONS

International Search Report & Written Opinion dated Mar. 18, 2016 regarding PCT/CN2015/096938.
The First Office Action in the Chinese Patent Application No. 201510263825.7, dated Oct. 9, 2017; English translation attached.

\* cited by examiner

| Forming a metal lead on a base substrate, at least a portion of which having a curved configuration in plan view of the base substrate. |
|---|

| Depositing a seal and forming a seal frame on the base substrate. |
|---|

| Providing a cover plate on the seal frame; and sealing the cover plate and the base substrate together with the seal frame. |
|---|

LIGHT EMITTING DIODE PACKAGING STRUCTURE AND PACKAGING METHOD

CROSS-REFERENCE TO RELATED APPLICATION

This application is a national stage application under 35 U.S.C. § 371 of International Application No. PCT/CN2015/096938 filed Dec. 10, 2015, which claims priority to Chinese Patent Application No. 201510263825.7, filed May 21, 2015, the contents of which are incorporated by reference in the entirety.

FIELD

The present invention relates to light emitting diode technology, more particularly, to a packaging structure of a light emitting diode and a method of manufacturing thereof.

BACKGROUND

Light emitting diode (LED) display, in particular, organic light emitting display (OLED) or organic electroluminescence display (OELD) has been a promising display technology due to good color contrast, active light-emitting, wide viewing angle, thinness, fast response speed and low power consumption. The electrodes and light emitting layers within a LED display device may fail if they encounter with water and/or oxygen. In general, the LED display device are sealed to avoid contact with water or oxygen. In the early packaging methods, a good sealing is not always possible therefore a desiccant or drier sheet is also provided inside the LED device.

SUMMARY

The present invention provides a light emitting diode packaging structure comprising a base substrate; a metal lead on the base substrate; a cover plate; and a seal frame sealing the cover plate and the base substrate together and forming an enclosure surrounding a display area of the base substrate. The metal lead extends from the display area outwardly and passes through below the seal frame to outside of the enclosure. The metal lead has a curved configuration in plan view of the base substrate within a region where the metal lead overlaps with the seal frame.

Optionally, the seal frame is formed from a glass frit seal.

Optionally, the curved configuration is an undulation configuration.

Optionally, at least a portion of the metal lead in the region where the metal lead overlaps with the seal frame has a first cross-section which increases adhesion or contact area between the metal lead and the seal frame as compared to a metal lead having a rectangular cross-section.

Optionally, the first cross-section is wide at top and narrow at bottom, the top of the first cross-section being proximal to the cover plate and the bottom of the first cross-section being proximal to the base substrate.

Optionally, the first cross-section has an inverted trapezoid shape.

Optionally, the first cross-section is wide at top and bottom and narrow in center with one or both sides being non-linear and concave inward, the top of the first cross-section being proximal to the cover plate and the bottom of the first cross-section being proximal to the base substrate.

Optionally, the first cross-section of the metal lead has a shape comprising an inverted trapezoid stacked on top of a trapezoid, the base of the inverted trapezoid being proximal to the cover plate and the base of the trapezoid being proximal to the base substrate.

Optionally, the metal lead is made of a single layer metal thin film or a laminated metal lead having two or more metal thin film layers.

Optionally, the laminated metal lead comprises a Titanium thin film layer and an Aluminum thin film layer.

Optionally, the laminated metal lead comprises an Aluminum thin film layer sandwiched by two Titanium thin film layers.

Optionally, the metal lead comprises one or more of a clock signal line, a power line, a ground line, a data signal line, and a touch signal line.

The present invention also provides a method of packaging a light emitting diode, comprising forming a metal lead on a base substrate, at least a portion of which having a curved configuration in plan view of the base substrate; depositing a seal and forming a seal frame on the base substrate; providing a cover plate on the seal frame; and sealing the cover plate and the base substrate together with the seal frame, wherein the seal frame, the cover plate, and the base substrate form an enclosure surrounding a display area of the base substrate. The metal lead extends from the display area outwardly and passes through below the seal frame to outside of the enclosure. The metal lead has the curved configuration in plan view of the base substrate within a region where the metal lead overlaps with the seal frame.

Optionally, the seal is a glass fit seal, and the sealing step comprises heating the glass frit seal to a temperature such that it fuses, thereby bonding itself to the cover plate, the base substrate, and the metal lead.

Optionally, the heating comprises welding the glass frit seal by using laser light.

Optionally, the step of forming the metal lead comprises depositing on the base substrate a metal lead; patterning the metal lead so that at least a portion of the metal lead has a first cross-section in a region where the metal lead overlaps with the seal frame.

Optionally, the first cross-section increases adhesion or contact area between the metal lead and the seal frame as compared to a metal lead having a rectangular cross-section.

Optionally, the first cross-section is wide at top and narrow at bottom; the top of the first cross-section being proximal to the cover plate and the bottom of the first cross-section being proximal to the base substrate.

Optionally, the first cross-section of the metal lead has an inverted trapezoid shape.

Optionally, the first cross-section is wide at top and bottom and narrow in center with one or both sides being non-linear and concave inward, the top of the first cross-section being proximal to the cover plate and the bottom of the first cross-section being proximal to the base substrate.

Optionally, the first cross-section of the metal lead has a shape comprising an inverted trapezoid stacked on top of a trapezoid, the base of the inverted trapezoid being proximal to the cover plate and the base of the trapezoid being proximal to the base substrate.

BRIEF DESCRIPTION OF THE FIGURES

The following drawings are merely examples for illustrative purposes according to various disclosed embodiments and are not intended to limit the scope of the present invention.

DETAILED DESCRIPTION OF THE EMBODIMENTS

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
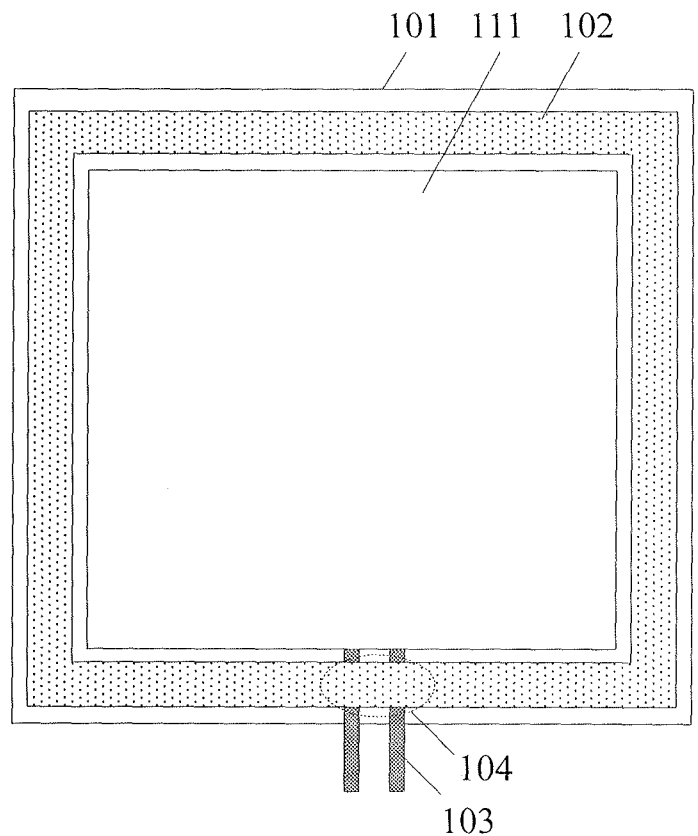
FIG. 1 is a diagram illustrating the structure of an active matrix organic light emitting diode (AMOLED) sealed by glass frit.

FIG. 1 is a diagram illustrating the structure of an active matrix organic light emitting diode (AMOLED) sealed by glass frit. The AMOLED in the embodiment includes a base substrate 101 and a cover plate. The base substrate 101 includes a display area 111 located in the center of the base substrate 101. A seal frame 102 forms a closed ring structure surrounding the display area 111. A metal lead 103 connects the display area 111 to a driver circuit outside of the seal frame. The metal lead 103 is disposed on the base substrate 101 before the seal frame 102 is place on the base substrate 101. The seal frame 102 bonds with the cover plate, the base substrate 101, and the metal lead 103, thereby seals the AMOLED.

Figure 2:
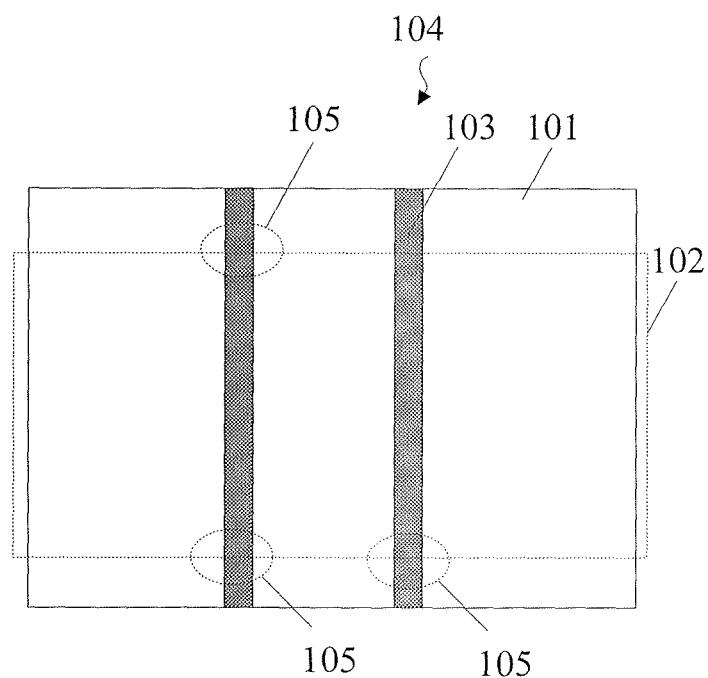
FIG. 2 is a schematic perspective view of a region where the metal lead overlaps with the seal frame in the AMOLED of FIG. 1.

Thermal expansion coefficient of a metal lead 103 is quite different from that of the seal frame 102 (e.g., a glass material). Significant thermal stress may be induced between the metal lead 103 and the seal frame 102 during a laser welding process for fusing the seal. The thermal stress may propagate along the metal lead 103 and concentrate on a brittle point 105 located along the inner and outer edges of the seal frame 102 (see FIG. 2). This thermal stress may result in deformation around the brittle point (e.g., fish-scale type deformation), The base substrate 101 may be detached from the cover plate 102 due to thermal stress and deformation.

Figure 3:
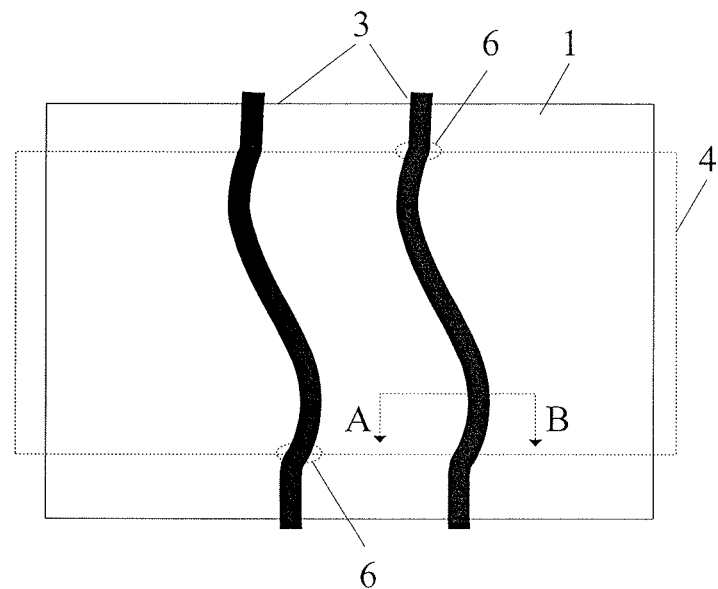
FIG. 3 is a schematic perspective view of a region where the metal lead overlaps with the seal frame in a light emitting diode according to an embodiment.

FIG. 3 is a schematic perspective view of a region where the metal lead overlaps with the seal frame in a light emitting diode according to an embodiment. Referring to FIG. 3, the light emitting diode packaging structure in the embodiment includes a base substrate 1, a cover plate 2, and one or more metal lead 3. The base substrate 1 and the cover plate 2 are sealed together by a seal frame 4. The seal frame 4, the base substrate 1, and the cover plate 2 form an enclosure surrounding a display area of the base substrate. The metal lead 3 extends from the display area outwardly, and passes through below the seal frame 4 to outside of the enclosure.

The light emitting diode can be, for example, a LED, an OLED, or an AMOLED. The seal frame can be made of any seal such as a glass frit seal, a solder seal, a glue seal, an adhesive seal (e.g., an epoxy seal). The seal frame 4 can contain organic or inorganic material, e.g., glass or organic adhesives. Glass materials useful for making the seal frame 4 include, but are not limited to, magnesium oxide, calcium oxide, barium oxide, lithium oxide, sodium oxide, potassium oxide, vanadium oxide, zinc oxide, tellurium oxide aluminum oxide, silicon dioxide, lead oxide, tin oxide, phosphorous oxide, ruthenium oxide, rubidium oxide, rhodium oxide, ferric oxide, copper oxide, titanium oxide, tungsten oxide, bismuth oxide, stibium oxide, or combinations thereof.

In plan view of the base substrate 1, at least a portion of the metal lead 3 has a curved configuration within the region where the metal lead 3 overlaps with the seal frame 4. At various points along the curve, the thermal stress induced by heat between the metal lead 3 and the seal frame 4 propagates along different directions. Consequently, the thermal stress dissipates throughout the overlapping region rather than concentrates around the brittle points in the seal frame 4 (e.g., at the intersecting points among the metal lead 3, the cover plate 2, and the base substrate 1). Deformation such as a fish-scale type deformation can therefore be avoided. A curved configuration includes a smoothly curved configuration (e.g., without sharp edges or angles) or a non-smoothly curved configuration (e.g., an angled configuration). Optionally, the curved configuration is a smoothly curved configuration, e.g., an undulation configuration. Examples of curved configuration include, but are not limited to, S-curve, hyperbola curve, parabola curve, catenary curve, trajectory curve, etc. A curved configuration also increases the contact area between the metal lead 3 and the seal frame 4, thereby increases adhesion between the metal lead 3 and the seal frame 4.

Figure 4:
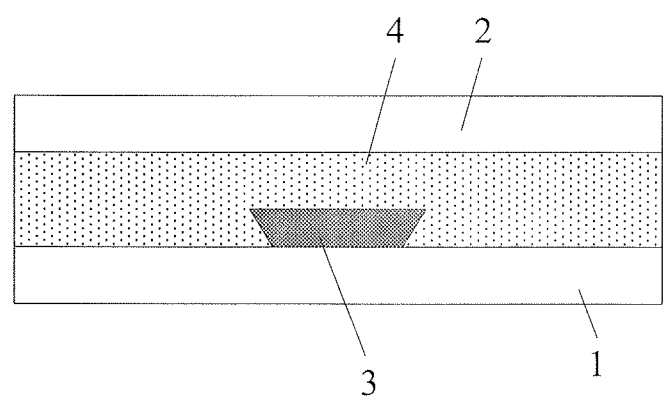
FIG. 4 is a cross-sectional view of a light emitting diode in one embodiment taken along section line A-B of FIG. 3.
Figure 5:
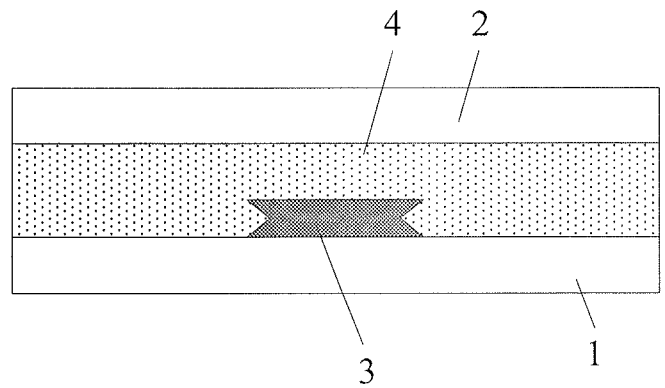
FIG. 5 is a cross-sectional view of a light emitting diode in another embodiment taken along section line A-B of FIG. 3.

At least in the region where the metal lead overlaps with the seal frame, a cross-section of at least a portion of the metal lead can be so designed to further increase the adhesion between the metal lead 3 and the seal frame 4. For example, the cross-section can be designed to increase the contact area between the metal lead 3 and the seal frame 4. In some embodiments, one or more sides of the cross-section is not flat, e.g., is concave inward, or convex outward, or having multiple protrusions. Optionally, the cross-section is wide at top and narrow at bottom, e.g., an inverted trapezoid shape (see, e.g., FIG. 4). The top of the cross-section is proximal to the cover plate and the bottom of the cross-section is proximal to the base substrate. Optionally, the cross-section is wide at top and bottom and narrow in center, e.g., one or two sides of the cross-section are concave inward. The sides of the cross-section can be non-linear or curved. Optionally, the cross-section has a shape comprising an inverted trapezoid stacked on top of a trapezoid, the base of the inverted trapezoid being proximal to the cover plate and the base of the trapezoid being proximal to the base substrate (see, e.g., FIG. 5). The term non-linear refers to a shape that is not completely linear, i.e., not straight. A non-linear line between two points can be any line that is not the shortest distance line. For example, a non-linear line can be a smoothly curved line or non-smoothly curved line (e.g., a polygonal line), or can contain a combination of two or more of a smoothly curved line, a non-smoothly curved line and a straight line. Optionally, the cross-section does not have a shape that is a square, rectangle, circle, or ellipse. Optionally, the cross-section has a shape that is a square, rectangle, circle, or ellipse.

Figure 6:
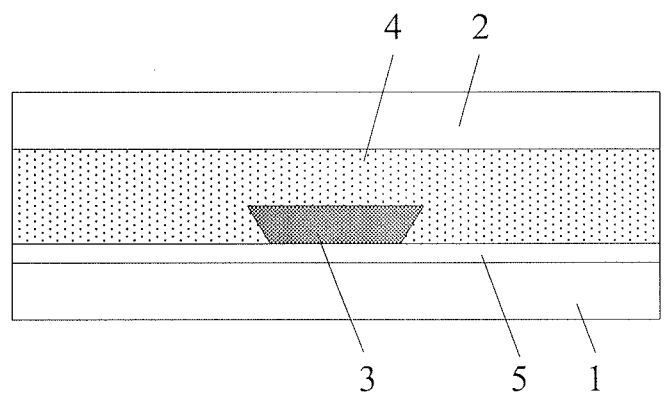
FIG. 6 is a cross-sectional view of a light emitting diode in another embodiment taken along section line A-B of FIG. 3.

The metal lead 3 can be disposed directly on the base substrate 1 or disposed indirectly on the base substrate 1. As shown in FIG. 6, the metal lead 3 can be disposed indirectly on the base substrate 1 through an insulating layer 5.

Figure 7:
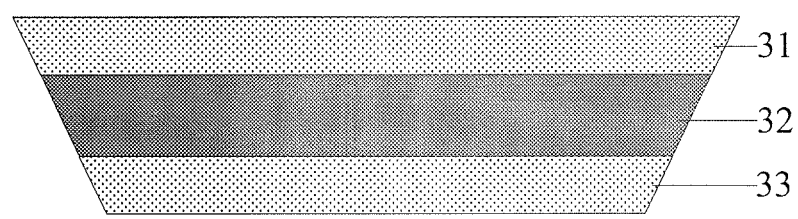
FIG. 7 is a cross-sectional view of a metal lead in an embodiment.

The metal lead 3 may adopt various structures. For example, the metal lead 3 can be a single layer metal thin film (e.g., a single layer aluminum thin film, a single layer copper thin film, or a single layer alloy thin film) or a laminated metal lead having two or more metal thin film layers (e.g., two or more metal thin film layers made of a same metal or different metals). Optionally, the laminated metal lead includes at least one Titanium thin film layer and at least one Aluminum thin film layer. Optionally, as shown in FIG. 7, the laminated metal lead comprises an Aluminum thin film layer 32 sandwiched by two Titanium thin film layers 31 and 33. The metal lead may include one or more of a clock signal line, a power line, a ground line, a data signal line, and a touch signal line depending on various applications.

Figure 8:
FIG. 8 is a flow chart illustrating a light emitting diode packaging method according to one embodiment.
Figure 8:

FIG. 8 is a flow chart illustrating a light emitting diode packaging method according to one embodiment. Referring to FIG. 8, the method in the embodiment includes forming a metal lead on a base substrate, at least a portion of which having a curved configuration in plan view of the base substrate; depositing a seal and forming a seal frame on the base substrate; providing a cover plate on the seal frame; and sealing the cover plate and the base substrate together with the seal frame. The seal frame, the cover plate, and the base substrate form an enclosure surrounding a display area of the base substrate. The metal lead extends from the display area outwardly and passes through below the seal frame to outside of the enclosure. At least a portion of the metal lead has a curved configuration in plan view of the base substrate at least within the region where the metal lead overlaps with the seal frame. Optionally, the method further includes a step of forming an insulating layer on the base substrate. Optionally, the insulating layer is disposed between the base substrate and the metal lead, i.e., the metal lead is disposed indirectly on the base substrate.

In some embodiments, the seal is a glass frit seal, and the sealing step includes heating the glass frit seal to a temperature such that it fuses, thereby bonding itself to the cover plate, the base substrate, and the metal lead. Optionally, the heating step is performed by welding the glass frit seal by using laser light. The temperature suitable for heating and fusing the glass frit seal largely depends on the glass frit seal material. Optionally, the temperature is between 350° C. and 400° C., between 400° C. and 450° C., between 450° C. and 500° C.

Optionally, the metal lead is formed by depositing on the base substrate a metal lead. The metal lead can be made of a single layer metal thin film or a laminated metal lead having two or more metal thin film layers, followed by patterning the metal lead thin film to have a predetermined cross-section at least in a region where the metal lead overlaps with the seal frame. In some embodiments, the cross-section of the metal lead is wide at top and narrow at bottom. In some embodiments, the cross-section is wide at top and bottom and narrow in center. The top of the cross-section is proximal to the cover plate and the bottom of the cross-section is proximal to the base substrate. Optionally, the cross-section of the metal lead has an inverted trapezoid shape. Optionally, the cross-section of the metal lead has a shape comprising an inverted trapezoid stacked on top of a trapezoid, the base of the inverted trapezoid being the side proximal to the cover plate and the base of the trapezoid being the side proximal to the base substrate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light emitting diode packaging structure comprising:
   a base substrate;
   a metal lead on the base substrate;
   a cover plate; and
   a seal frame sealing the cover plate and the base substrate together and forming an enclosure surrounding a display area of the base substrate;
   wherein the metal lead comprises a first segment in direct contact with the seal frame and passing through the seal frame from inside of the enclosure to outside of the enclosure;
   the first segment has a smoothly curved configuration without sharp edges and angles;
   the first segment is in a region in which an orthographic projection of the seal frame substantially covers an orthographic projection of the metal lead in plan view of the base substrate;
   the first segment has a first end and a second end opposite to the first end;
   the seal frame has a first side adjacent to the inside of the enclosure and a second side opposite to the first side and adjacent to the outside of the enclosure; and
   the first end is at the first side and the second end is at the second side.

2. The light emitting diode packaging structure of claim 1, wherein the seal frame is formed from a glass frit seal.

3. The light emitting diode packaging structure of claim 1, wherein the smoothly curved configuration is one or a combination of a S-curve configuration, a hyperbola curve configuration, a parabola curve configuration, and a catenary curve configuration.

4. The light emitting diode packaging structure of claim 1, wherein at least a portion of the metal lead in the region where the metal lead overlaps with the seal frame has a first cross-section which increases adhesion between the metal lead and the seal frame as compared to a metal lead having a rectangular cross-section.

5. The light emitting diode packaging structure of claim 4, wherein the first cross-section is wide at top and narrow at bottom, a top of the first cross-section being proximal to the cover plate and a bottom of the first cross-section being proximal to the base substrate.

6. The light emitting diode packaging structure of claim 5, wherein the first cross-section has an inverted trapezoid shape.

7. The light emitting diode packaging structure of claim 4, wherein the first cross-section is wide at top and bottom and narrow in center with one or both sides being non-linear and concave inward, a top of the first cross-section being proximal to the cover plate and a bottom of the first cross-section being proximal to the base substrate.

8. The light emitting diode packaging structure of claim 7, wherein the first cross-section of the metal lead has a shape comprising an inverted trapezoid stacked on top of a trapezoid, a base of the inverted trapezoid being proximal to the cover plate and a base of the trapezoid being proximal to the base substrate.

9. The light emitting diode packaging structure of claim 1, wherein the metal lead is made of a single layer metal thin film or a laminated metal lead having two or more metal thin film layers.

10. The light emitting diode packaging structure of claim 9, wherein the laminated metal lead comprises a Titanium thin film layer and an Aluminum thin film layer.

11. The light emitting diode packaging structure of claim 9, wherein the laminated metal lead comprises an Aluminum thin film layer sandwiched by two Titanium thin film layers.

12. The light emitting diode packaging structure of claim 1, wherein the metal lead comprises one or more of a clock signal line, a power line, a ground line, a data signal line, and a touch signal line.

13. A method of packaging a light emitting diode, comprising:
depositing a seal and forming a seal frame on the base substrate;
providing a cover plate on the seal frame; and
sealing the cover plate and the base substrate together with the seal frame, wherein the seal frame, the cover plate, and the base substrate form an enclosure surrounding a display area of the base substrate;
wherein forming the metal lead comprises forming a first segment in direct contact with the seal frame and passing through the seal frame from inside of the enclosure to outside of the enclosure;
the first segment is formed to have a smoothly curved configuration without sharp edges and angles;
the first segment is formed in a region in which an orthographic projection of the seal frame substantially covers an orthographic projection of the metal lead in plan view of the base substrate;
the first segment is formed to have a first end and a second end opposite to the first end;
the seal frame is formed to have a first side adjacent to the inside of the enclosure and a second side opposite to the first side and adjacent to the outside of the enclosure; and
the first end is at the first side and the second end is at the second side.

14. The method of claim 13, wherein the seal is a glass frit seal, and
sealing the cover plate and the base substrate together with the seal frame comprises heating the glass frit seal to a temperature such that it fuses, thereby bonding itself to the cover plate, the base substrate, and the metal lead.

15. The method of claim 14, wherein heating the glass frit seal comprises welding the glass frit seal by using laser light.

16. The method of claim 13, wherein forming the metal lead comprises:
depositing on the base substrate a metal lead; and
patterning the metal lead so that at least a portion of the metal lead has a first cross-section in a region where the metal lead overlaps with the seal frame;
wherein the first cross-section increases adhesion between the metal lead and the seal frame as compared to a metal lead having a rectangular cross-section.

17. The method of claim 16, wherein the first cross-section is wide at top and narrow at bottom; a top of the first cross-section being proximal to the cover plate and a bottom of the first cross-section being proximal to the base substrate.

18. The method of claim 17, wherein the first cross-section of the metal lead has an inverted trapezoid shape.

19. The method of claim 16, wherein the first cross-section is wide at top and bottom and narrow in center with one or both sides being non-linear and concave inward, a top of the first cross-section being proximal to the cover plate and a bottom of the first cross-section being proximal to the base substrate.

20. The method of claim 19, wherein the first cross-section of the metal lead has a shape comprising an inverted trapezoid stacked on top of a trapezoid, a base of the inverted trapezoid being proximal to the cover plate and a base of the trapezoid being proximal to the base substrate.

* * * * *